(12) United States Patent
Huang et al.

(10) Patent No.: US 8,431,460 B2
(45) Date of Patent: Apr. 30, 2013

(54) METHOD FOR FABRICATING SEMICONDUCTOR DEVICE

(75) Inventors: Shin-Chuan Huang, Tainan County (TW); Guang-Yaw Hwang, Tainan County (TW); Hsiang-Ying Wang, Chiai (TW); Yu-Hsiang Hung, Tainan (TW); I-Chang Wang, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/117,518

(22) Filed: May 27, 2011

(65) Prior Publication Data

US 2012/0299058 A1 Nov. 29, 2012

(51) Int. Cl.
*H01L 21/336* (2006.01)

(52) U.S. Cl.
USPC ........... 438/301; 438/300; 257/409; 257/496; 257/487; 257/E29.023

(58) Field of Classification Search .................. 257/401, 257/409, 487, 496, E29.023; 438/301, 300
See application file for complete search history.

(56) References Cited

U.S. PATENT DOCUMENTS

| | | | |
|---|---|---|---|
| 4,891,303 A | 1/1990 | Garza |
| 5,217,910 A | 6/1993 | Shimizu |
| 5,273,930 A | 12/1993 | Steele |
| 5,356,830 A | 10/1994 | Yoshikawa |
| 5,372,957 A | 12/1994 | Liang |
| 5,385,630 A | 1/1995 | Philipossian |
| 5,399,506 A | 3/1995 | Tsukamoto |
| 5,625,217 A | 4/1997 | Chau |
| 5,714,765 A * | 2/1998 | Noetzel et al. .................. 257/17 |
| 5,777,364 A | 7/1998 | Crabbe |
| 5,783,478 A | 7/1998 | Chau |
| 5,783,479 A | 7/1998 | Lin |
| 5,793,090 A | 8/1998 | Gardner |
| 5,960,322 A | 9/1999 | Xiang |
| 6,030,874 A | 2/2000 | Grider |
| 6,048,756 A | 4/2000 | Lee |
| 6,074,954 A | 6/2000 | Lill |
| 6,100,171 A | 8/2000 | Ishida |
| 6,110,787 A | 8/2000 | Chan |
| 6,165,826 A | 12/2000 | Chau |
| 6,165,881 A | 12/2000 | Tao |
| 6,191,052 B1 | 2/2001 | Wang |
| 6,228,730 B1 | 5/2001 | Chen |
| 6,274,447 B1 | 8/2001 | Takasou |
| 6,355,533 B2 | 3/2002 | Lee |
| 6,365,476 B1 | 4/2002 | Talwar |
| 6,368,926 B1 | 4/2002 | Wu |
| 6,444,591 B1 | 9/2002 | Schuegraf |
| 6,537,370 B1 | 3/2003 | Hernandez |
| 6,544,822 B2 | 4/2003 | Kim |
| 6,605,498 B1 | 8/2003 | Murthy |
| 6,613,695 B2 | 9/2003 | Pomarede |

(Continued)

*Primary Examiner* — Julio J Maldonado
*Assistant Examiner* — Amar Movva
(74) *Attorney, Agent, or Firm* — Ding Yu Tan (57) ABSTRACT

A semiconductor device comprising a silicon substrate, a gate structure and a heteroatom-containing epitaxial structure is provided. The gate structure is disposed on a surface of the silicon substrate. The heteroatom-containing epitaxial structure is disposed adjacent to the gate structure and has a major portion and an extension portion, wherein the major portion virtual vertically extends downwards into the silicon substrate from the surface; and the extension portion further extends downwards into the silicon substrate with a tapered cross-section continuing with the major portion.

8 Claims, 9 Drawing Sheets

U.S. PATENT DOCUMENTS

| | | |
|---|---|---|
| 6,621,131 B2 | 9/2003 | Murthy |
| 6,624,068 B2 | 9/2003 | Thakar |
| 6,632,718 B1 | 10/2003 | Grider |
| 6,642,122 B1 | 11/2003 | Yu |
| 6,664,156 B1 | 12/2003 | Ang |
| 6,676,764 B2 | 1/2004 | Joo |
| 6,699,763 B2 | 3/2004 | Grider |
| 6,703,271 B2 | 3/2004 | Yeo |
| 6,777,275 B1 | 8/2004 | Kluth |
| 6,806,151 B2 | 10/2004 | Wasshuber |
| 6,809,402 B1 | 10/2004 | Hopper |
| 6,858,506 B2 | 2/2005 | Chang |
| 6,861,318 B2 | 3/2005 | Murthy |
| 6,864,135 B2 | 3/2005 | Grudowski |
| 6,869,867 B2 | 3/2005 | Miyashita |
| 6,887,751 B2 | 5/2005 | Chidambarrao |
| 6,887,762 B1 | 5/2005 | Murthy |
| 6,891,192 B2 | 5/2005 | Chen |
| 6,930,007 B2 | 8/2005 | Bu |
| 6,946,350 B2 | 9/2005 | Lindert |
| 6,972,461 B1 | 12/2005 | Chen |
| 6,991,979 B2 | 1/2006 | Ajmera |
| 6,991,991 B2 | 1/2006 | Cheng |
| 7,037,773 B2 | 5/2006 | Wang |
| 7,060,576 B2 | 6/2006 | Lindert |
| 7,060,579 B2 | 6/2006 | Chidambaram |
| 7,112,495 B2 | 9/2006 | Ko |
| 7,118,952 B2 | 10/2006 | Chen |
| 7,132,338 B2 | 11/2006 | Samoilov |
| 7,169,675 B2 | 1/2007 | Tan |
| 7,183,596 B2 | 2/2007 | Wu |
| 7,202,124 B2 | 4/2007 | Fitzgerald |
| 7,217,627 B2 | 5/2007 | Kim |
| 7,288,822 B1 | 10/2007 | Ting |
| 7,335,959 B2 | 2/2008 | Curello |
| 7,410,859 B1 | 8/2008 | Peidous |
| 7,494,856 B2 | 2/2009 | Zhang |
| 7,560,758 B2 | 7/2009 | Zhu |
| 7,592,231 B2 | 9/2009 | Cheng |
| 7,667,227 B2 | 2/2010 | Shimamune |
| 2002/0160587 A1 | 10/2002 | Jagannathan et al. |
| 2002/0182423 A1 | 12/2002 | Chu |
| 2003/0181005 A1 | 9/2003 | Hachimine |
| 2003/0203599 A1 | 10/2003 | Kanzawa |
| 2004/0045499 A1 | 3/2004 | Langdo |
| 2004/0067631 A1 | 4/2004 | Bu et al. |
| 2004/0227164 A1 | 11/2004 | Lee |
| 2005/0070076 A1 | 3/2005 | Dion |
| 2005/0079692 A1 | 4/2005 | Samoilov |
| 2005/0082616 A1 | 4/2005 | Chen |
| 2005/0139231 A1 | 6/2005 | Abadie |
| 2005/0260830 A1 | 11/2005 | Kwon |
| 2005/0285193 A1 | 12/2005 | Lee |
| 2005/0287752 A1 | 12/2005 | Nouri |
| 2006/0051922 A1 | 3/2006 | Huang |
| 2006/0057859 A1 | 3/2006 | Chen |
| 2006/0076627 A1 | 4/2006 | Chen |
| 2006/0088968 A1 | 4/2006 | Shin |
| 2006/0115949 A1 | 6/2006 | Zhang et al. |
| 2006/0134872 A1 | 6/2006 | Hattendorf |
| 2006/0163558 A1 | 7/2006 | Lee |
| 2006/0228842 A1 | 10/2006 | Zhang |
| 2006/0231826 A1 | 10/2006 | Kohyama |
| 2006/0258126 A1 | 11/2006 | Shiono |
| 2006/0281288 A1 | 12/2006 | Kawamura |
| 2006/0292779 A1 | 12/2006 | Chen |
| 2006/0292783 A1 | 12/2006 | Lee |
| 2007/0023847 A1 | 2/2007 | Rhee |
| 2007/0034906 A1 | 2/2007 | Wang |
| 2007/0049014 A1 | 3/2007 | Chen |
| 2007/0072353 A1 | 3/2007 | Wu |
| 2007/0082451 A1 | 4/2007 | Samoilov |
| 2007/0128783 A1 | 6/2007 | Ting |
| 2007/0128786 A1 | 6/2007 | Cheng |
| 2007/0166929 A1 | 7/2007 | Matsumoto |
| 2007/0262396 A1 | 11/2007 | Zhu |
| 2008/0014688 A1 | 1/2008 | Thean |
| 2008/0067545 A1 | 3/2008 | Rhee |
| 2008/0076236 A1 | 3/2008 | Chiang |
| 2008/0085577 A1 | 4/2008 | Shih |
| 2008/0116525 A1 | 5/2008 | Liu |
| 2008/0124874 A1 | 5/2008 | Park |
| 2008/0128746 A1 | 6/2008 | Wang |
| 2008/0142886 A1 | 6/2008 | Liao |
| 2008/0220579 A1 | 9/2008 | Pal |
| 2008/0233722 A1 | 9/2008 | Liao |
| 2008/0233746 A1 | 9/2008 | Huang |
| 2009/0039389 A1 | 2/2009 | Tseng |
| 2009/0095992 A1 | 4/2009 | Sanuki |
| 2009/0108291 A1* | 4/2009 | Cheng et al. ............... 257/190 |
| 2009/0117715 A1 | 5/2009 | Fukuda |
| 2009/0124056 A1 | 5/2009 | Chen |
| 2009/0166625 A1 | 7/2009 | Ting et al. |
| 2009/0186475 A1 | 7/2009 | Ting |
| 2009/0246922 A1 | 10/2009 | Wu et al. |
| 2009/0278170 A1 | 11/2009 | Yang |
| 2009/0289305 A1 | 11/2009 | Majumdar |
| 2010/0001317 A1 | 1/2010 | Chen |
| 2010/0093147 A1* | 4/2010 | Liao et al. ............... 438/300 |

* cited by examiner

METHOD FOR FABRICATING SEMICONDUCTOR DEVICE

FIELD OF THE INVENTION

The present invention relates to a semiconductor device and the method for fabricating the same, more particularly to a field effect transistor (FET) and the method for manufacturing the same.

BACKGROUND OF THE INVENTION

With the development of the electrical technology, a FET with high integrity and operation speed is required. However, the operation speed of the FET is difficult to be improved due the steady electron (hole) migration rate in a silicon substrate, thus the utility of the FET may be limited.

In comparison with silicon, silicon germanium (SiGe) has a greater lattice constant, thus when SiGe is utilized to form a drain/source structure of a FET, a extrusion stress can be imposed to the channel of the FET and the hole-mobility in the channel region can be enhanced. Currently, this SeGe drain/source structure has been provided by the prior art to improve the performance of a FET device.

Figure 1:
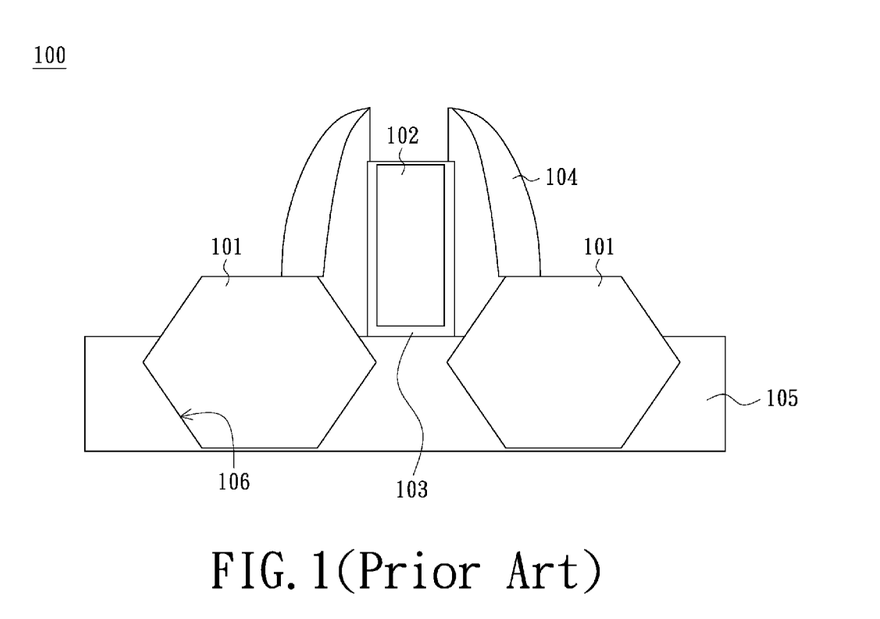
FIG. 1 illustrates a cross sectional view of a FET in accordance with the prior art.

FIG. 1 illustrates a cross sectional view of a FET 100 in accordance with the prior art. The FET 100 comprises a gate structure 102 and a SiGe drain/source structure 101 formed on a silicon substrate 105, wherein the SiGe drain/source structure 101 is formed by forming a SeGe material in a recess 106 formed in the silicon substrate 105 alongside the gate spacer 104. The SiGe material formed in the recess 106 is then subjected to a thermal annealing process to complete the process in fabricating the FET 100.

However, the etching reagent used to form the recess 106 may undercut the silicon substrate 105, such that the recess 106 may extend laterally into the channel region beneath the gate structure 102. After the SiGe material is annealed, the SiGe material may swell to form a diamond like SiGe drain/source structure 101 filling the recess 106, thus the channel distance may be shortened due to the extrusion of the SiGe drain/source structure 101, and a punch through effect triggered by the shortened channel may occur more easily.

Therefore, it is necessary to provide an improved method for fabricating a FET to obviate the drawbacks and problems encountered from the prior art.

SUMMARY OF THE INVENTION

One aspect of the present invention is to provide a semiconductor device comprising a silicon substrate, a gate structure and a heteroatom-containing epitaxial structure. The gate structure is disposed on a surface of the silicon substrate. The heteroatom-containing epitaxial structure is disposed adjacent to the gate structure and has a major portion and an extension portion, wherein the major portion virtual vertically extends downwards into the silicon substrate from the surface, and the extension portion further extends downwards into the silicon substrate with a tapered cross-section continuing with the major portion.

In one embodiment of the present invention, the semiconductor is a p-channel field effect transistor (P-FET).

In another embodiment of the present invention, the surface of the silicon substrate has a lattice direction in <110>.

Another aspect of the present invention is to provide a method for fabricating a semiconductor, wherein the method comprises steps as following: A silicon substrate is firstly provided, and a gate structure is then formed on a surface of the silicon substrate. Subsequently, a first silicon nitride layer is formed over the gate structure and the substrate. Next, a portion of the first silicon nitride layer and a portion of the silicon substrate are removed to form a first recess, but another portion of the first silicon nitride layer is remained on the gate structure. A patterned second silicon nitride layer is then formed to blanket over the remanding portion of the first silicon nitride layer and a portion of sidewalls of the first recess adjacent to the gate structure. A portion of the silicon substrate exposed from the first recess is then removed by using the patterned second silicon nitride layer as a mask so as to form a second recess substrate. Afterward, a heteroatom-containing epitaxial material is filled into the first recess and the second recess to form a heteroatom-containing epitaxial structure.

In one embodiment of the present invention, the semiconductor is a p-channel field effect transistor (P-FET).

In another embodiment of the present invention, the surface of the silicon substrate has a lattice direction in <110>.

In the embodiments of the present invention, the method further comprises step of defining a source/drain structure in the heteroatom-containing epitaxial structure.

In one embodiment of the present invention, the second recess has a recess with a lattice direction of <111>.

In one embodiment of the present invention, the method further comprises forming a first silicon oxide layer over the gate structure and the silicon substrate, preceding the formation of the first silicon nitride layer.

In one embodiment of the present invention, the method further comprises forming a second silicon oxide layer over the gate structure and the silicon substrate, preceding the formation of the second silicon nitride layer.

In some embodiment of the present invention, the steps for forming the second recess comprises a wet etching process utilizing ammonia ($NH_3$) as an etching agent.

In accordance with the aforementioned embodiments of the present invention, a semiconductor device with a heteroatom-containing epitaxial structure and the fabricating method thereof are provided. In the embodiments of the present invention, at least two silicon nitride layer are utilized in conjunction with at least two etching process to form a recess in the silicon substrate adjacent to a gate structure allowing the heteroatom-containing epitaxial structure formed therein. Since silicon nitride has better etching resistance than silicon, thus portions of the first silicon nitride layer and the second silicon nitride layer covered on the sidewalls of the gate structure can be remained during these two recess etching processes. The remained first silicon nitride layer can serve as a spacer of the gate structure to prevent the silicon substrate in adjacent to the foundation of the gate structure from being removed during the first etching process, such that the recess formed in adjacent to the foundation of the gate structure has virtual vertical sidewalls; and the remained second silicon nitride layer can be used to mask the virtual vertical sidewalls of the recess in order to avoid an undercut formed in the portion of the silicon substrate beneath the gate structure by the second etching process, such that the heteroatom-containing epitaxial structure subsequently formed in the recess shall not get close to each other to trigger the punch through effect. Therefore, the drawbacks and problems encountered from the prior art can be solved.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

The present invention is to provide a semiconductor device with a heteroatom-containing epitaxial structure and the fabricating method thereof, wherein the heteroatom is referred as the atoms differ from silicon, such as germanium (Ge) atom or carbon (C) atom. In some embodiments of the present invention, the semiconductor device preferably is a P-FET with an epitaxial structure containing Ge atoms. Otherwise, in some other embodiments, the semiconductor device may be a P-FET with an epitaxial structure containing C atoms.

FIGS. 2A to 2H illustrate cross sectional views of the processing structure for fabricating a FET 200 in accordance with one embodiment of the present invention. The method for fabricating the FET 200 comprises steps as follows:

A silicon substrate 201 is first provided and a gate structure 202 used to constitute the FET 200 is formed on a surface 201a of the silicon substrate 201. As shown in the FIG. 2A, the silicon substrate 201 is a silicon wafer having a lattice direction of <110>. Besides the gate structure 202, there is another gate structure 206 formed on the silicon substrate 202 used to constitute another FET isolated from the FET 200 by the shallow trench isolation (STI) 203.

Figure 2A:
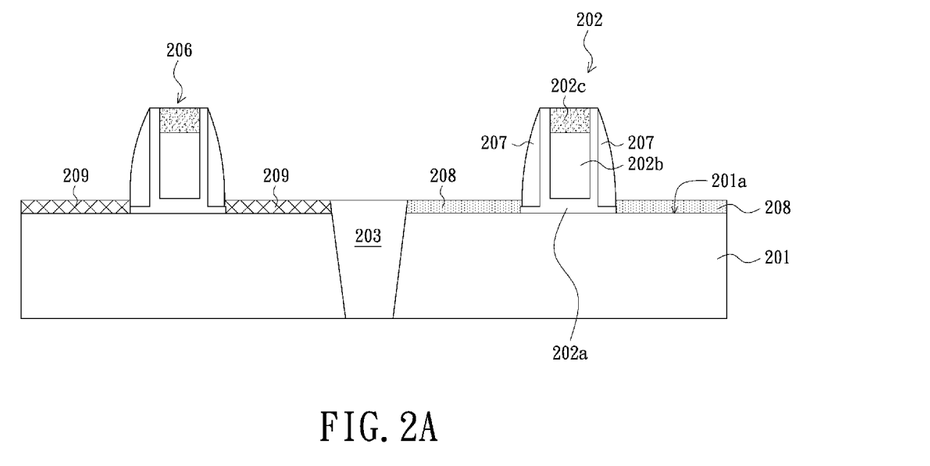
FIGS. 2A to 2H illustrate cross sectional views of the processing structure for fabricating a FET in accordance with one embodiment of the present invention.

In the present embodiment, the gate structure 202 comprises a gate dielectric layer 202a formed on the surface 201a of the silicon substrate 201 and a gate conductive layer 202b formed on the gate dielectric layer 202a. In some preferred embodiments, there are some spacers 207 consisting of silicon oxide or silicon nitride formed on the sidewalls of the gate structure 202 and a hard mask 202c formed on the gate conductive layer 202b.

After the gate structures 202 and 206 are formed, two different ion implantation processes are conducted on the periphery region of the gate structures 202 and 206 to form light doped drain (LDD) regions 208 and 209 respectively.

Figure 2B:
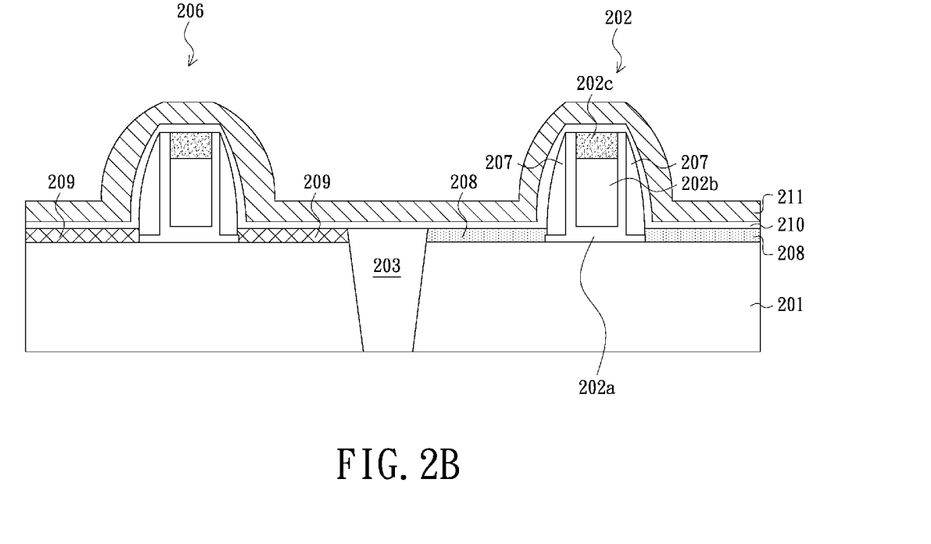
Figure 2C:
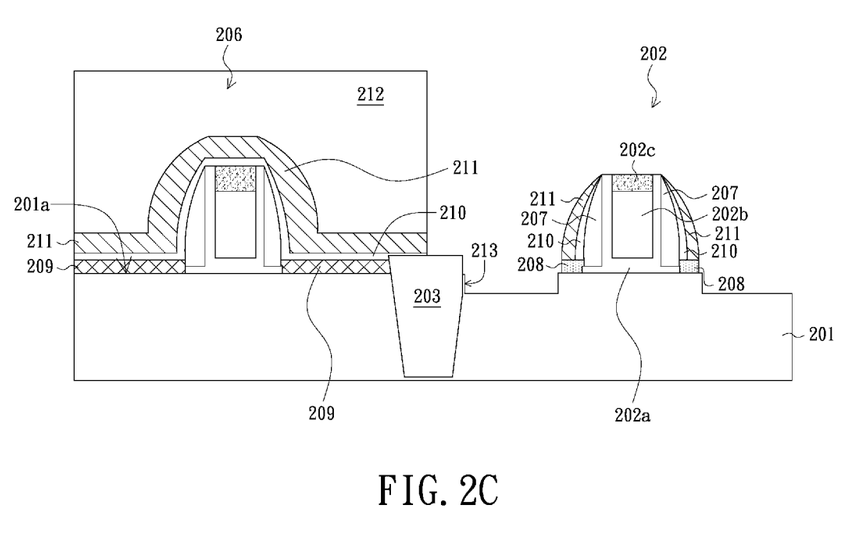

Subsequently, a silicon oxide layer 210 and a silicon nitride layer 211 are sequentially formed on the silicon substrate 201, the LDD regions 208 and 209 and the gate structures 202 and 206 (shown in FIG. 2B). A patterned photoresist 212 is then formed over the gate structure 206 serves as a mask and an etching process is conducted to remove portions of the silicon oxide layer 210, the silicon nitride layer 211 and the silicon substrate 201, whereby a recess 213 having sidewalls virtual perpendicular with the surface 201a of the substrate 201 is formed in the substrate adjacent to the gate structure 202.

It should appreciated that the recess 213 is formed in accordance with the profile of the patterned photoresist 212 theoretically having sidewalls perpendicular with the surface 201a of the substrate 201, such that the sidewalls of the recess 213 may be also perpendicular with the surface 201a of the substrate 201. However in practice, the sidewalls of the recess 213 may not completely perpendicular with the surface 201a of the substrate 201.

In some embodiments of the present invention, a dry etching process is preferably used to remove the portions of the silicon oxide layer 210, the silicon nitride layer 211 and the silicon substrate 201. Since the vertical thickness of the portions of the silicon oxide layer 210 and the silicon nitride layer 211 disposed on the spacer 207 are greater than that of the other portions of the silicon oxide layer 210 and the silicon nitride layer 211, thus the dry etching process merely removes the portions of the silicon oxide layer 210, the silicon nitride layer 211 disposed on the surface 201a of the substrate 201 and remains the portions of the silicon oxide layer 210 and the silicon nitride layer 211 disposed on the spacer 207, such that the remaining portions of the silicon oxide layer 210 and the silicon nitride layer 211 may serve as another mask to resist the dry etching process, whereby the recess 213 extends virtual vertically downwards from the surface 201a into the silicon substrate 201 adjacent to the foundation of the gate structure 202 (shown in FIG. 2C).

Figure 2D:
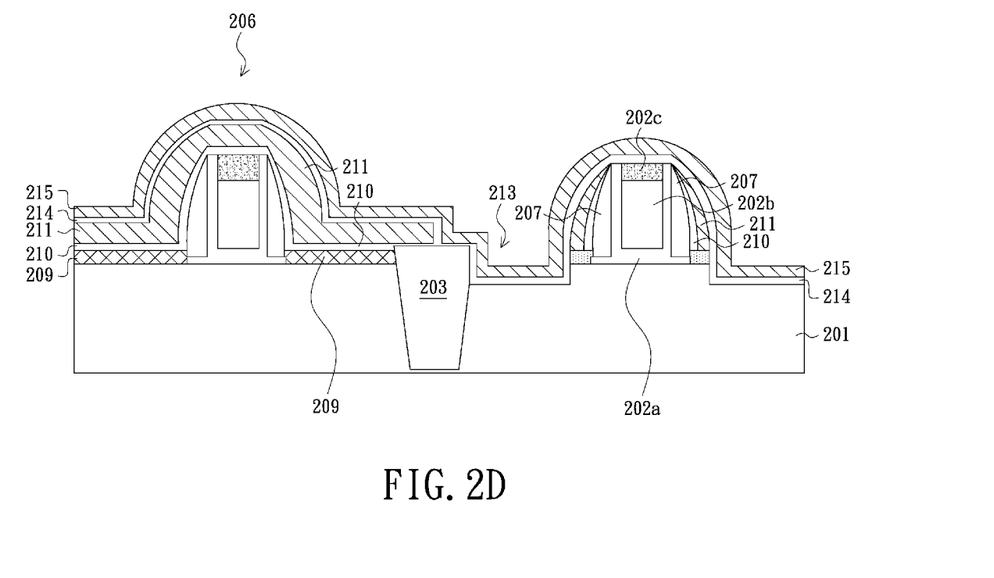

After the patterned photoresist 212 is stripped off, a silicon oxide 214 and a silicon nitride layer 215 are sequentially formed on the gate structures 202 and 206 and the portion of the silicon substrate 201 exposed by the recess 213 (shown in the FIG. 2D). Next, the silicon oxide layer 214 is used as an etching stop layer and an etching process is conducted to remove a portion of the silicon nitride 215, whereby the silicon nitride 215 is patterned and the portion of the silicon oxide 214 disposed on a portion of the sidewalls and the bottom of the recess 213 can be exposed. Similarly, since the vertical thickness of the portion of the silicon nitride 215 disposed on the spacer 207 is greater than that of the other portion of the silicon nitride 215, thus the portion of the silicon nitride 215 disposed on the spacer 207 and disposed on the potion of sidewalls of the of the recess 213 adjacent to the foundation of the gate structure 202 can also be remained (Shown in FIG. 2E).

Figure 2E:
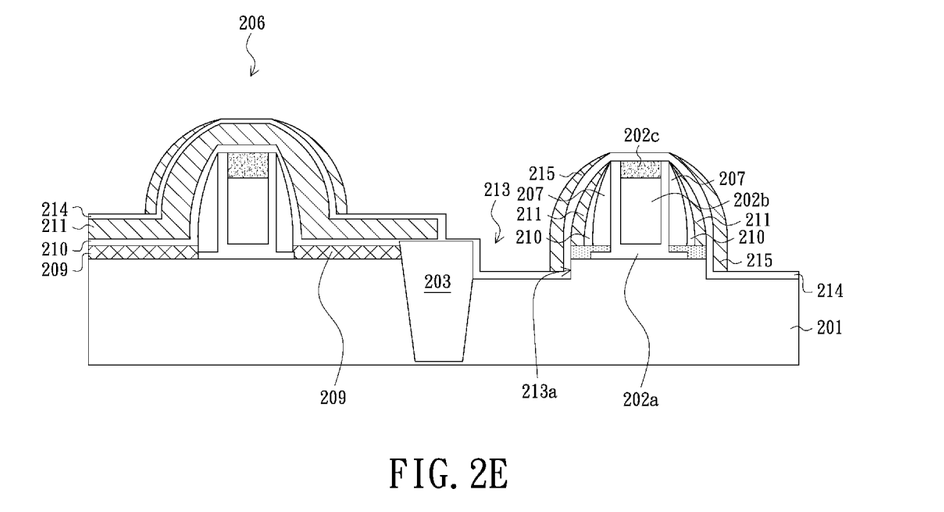

Subsequently, the remaining portion of the silicon nitride 215 is used as an etching mask and an etching process is conducted to remove the portion of the silicon oxide 214 disposed in the recess 213 and the silicon substrate 201 exposed by the recess 213, whereby a recess 216 continuing with the recess 213 and extending further downwards into the silicon substrate 201 is formed. In some embodiments of the present invention, the recess 216 preferably is formed by a wet etching process utilizing $NH_3$, hydrogen dioxide ($H_2O_2$) or tetramethyl ammonium hydroxide (TMAH) as the etching agent. In the present embodiment, the recess 216 preferably is formed by a wet etching process utilizing $NH_3$ as the etching agent.

Figure 2F:
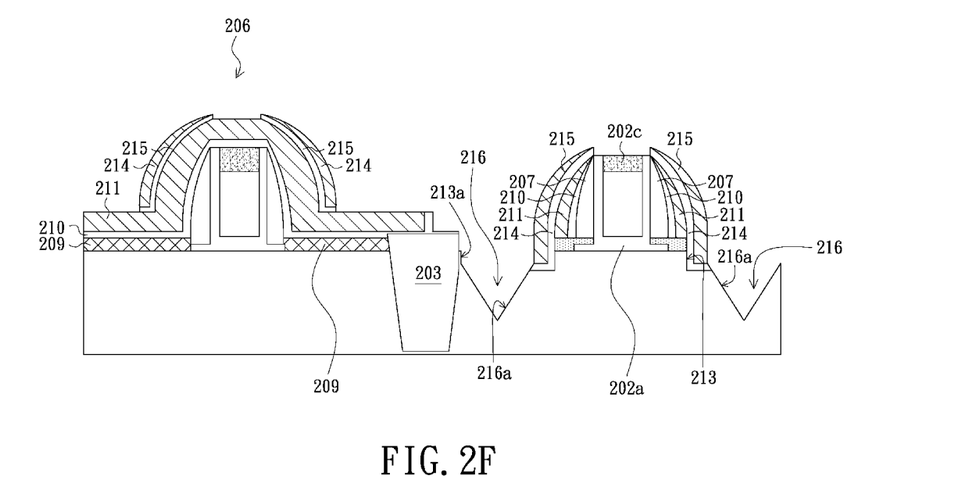

Since the aforementioned wet etching process is an anisotropic etching process, thus the recess 216 formed by the etching agent has tilted sidewalls 216 with a lattice direction of <111> (shown in FIG. 2F). Furthermore, since the remaining portion of the silicon nitride layer 215 is coated on the sidewalls 213a of the recess 213, thus the anisotropic etching can just react downwards along with the sidewalls of the recess 213 rather than undercut the sidewalls 213a of the recess 213 to remove the portion of the silicon substrate 201 beneath the gate structure 202. Therefore, the recess 216 formed by the etching agent has a tapered cross section continuous with the sidewalls of the recess 213.

After the remaining portions of the silicon oxide layer 214 and the silicon nitride layer 215 are removed, a SiGe epitaxial growth process is conducted to fill SiGe material into the recesses 213 and 216, so as to form a SiGe structure 217. The SiGe structure 217 is then subjected to a thermal annealing process and thereby the swells of the SiGe structure 217 can extend outwards the recess 213 from the surface 201a of the substrate 201. In some preferred embodiments, the atmosphere of the SiGe epitaxial growth process can be varied to manipulate the germanium concentration distribution of the SiGe structure 217.

Figure 2G:
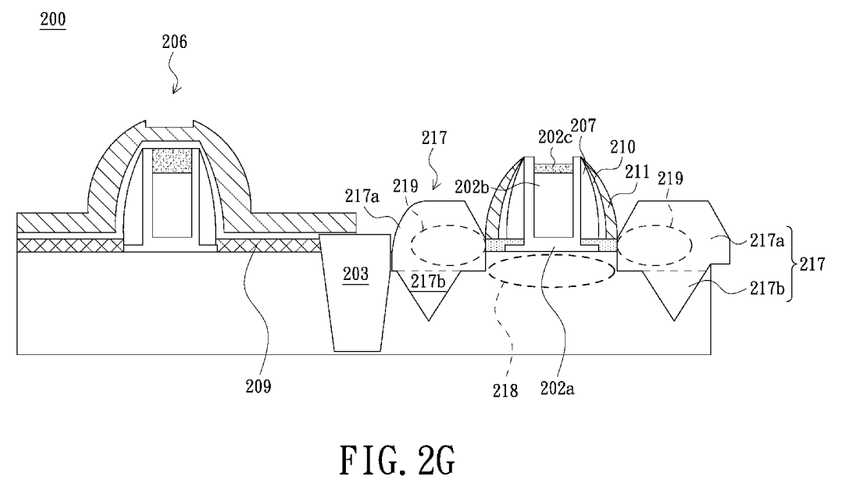

Subsequently, a source/drain implant process using the spacer 207, the remaining portions of the silicon nitride 211 and silicon oxide layer 210 as a mask is then conducted to implant ion dopants (such as P-type or N-type dopants) into the SiGe structure 217, whereby a source/drain area 219 is defined in the SiGe structure 217 (shown in FIG. 2G). Thereafter, the remaining portion of the silicon nitride 211 on the spacer 207 is removed to form the FET 200 (shown in FIG. 2H).

Figure 2H:
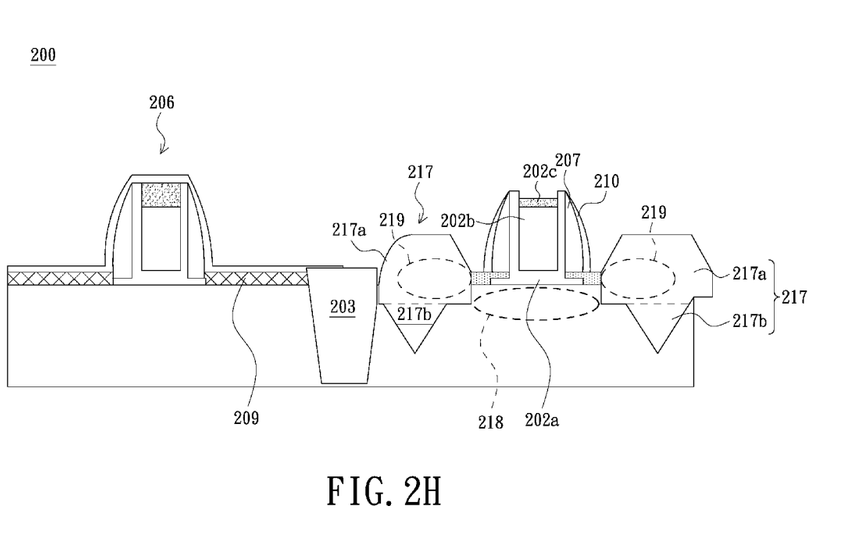

As shown in FIG. 2H, the SiGe structure 217 is disposed adjacent to the foundation of the gate structure 202 having a major portion 217a and an extension portion 217b, wherein the major portion 217a virtual vertically extends downwards into the silicon substrate 201 from the surface 201a, the extension portion 217b continues with the major portion 217a and further extends downwards into the silicon substrate 201 with a cross-section smaller than that of the major portion 217a.

since the side walls 213a of the recess 213 are perpendicular to the surface 201a of the substrate 201 and the recess 216 has tilted sidewalls 216a, thus of the SiGe structure 217 epitaxial grown along therewith may also have virtual vertical sidewalls (see the major portion 217a) and tilted sidewalls (see the major portion 217b) and shape as an ice cream cone. In other words, the structure 217 formed in the recesses 213 and 216 shall not get close to each other, such that the channel 218 of the FET 200, a region virtually defied in the silicon substrate 201 beneath the gate structure 202, shall not be shortened to trigger the punch through effect.

In accordance with the aforementioned embodiments of the present invention, a semiconductor device with a heteroatom-containing epitaxial structure and the fabricating method thereof are provided. In the embodiments of the present invention, at least two silicon nitride layer are utilized in conjunction with at least two etching process to form a recess in the silicon substrate adjacent to a gate structure allowing the SiGe structure formed therein. Since silicon nitride has better etching resistance than silicon, thus portions of the first silicon nitride layer and the second silicon nitride layer covered on the sidewalls of the gate structure can be remained during these two recess etching processes. The remained first silicon nitride layer can serve as a spacer of the gate structure to prevent the silicon substrate in adjacent to the foundation of the gate structure from being removed during the first etching process, such that the recess formed in adjacent to the foundation of the gate structure has virtual vertical sidewalls; and the remained second silicon nitride layer can be used to mask the vertical sidewalls of the recess in order to avoid an undercut formed in the portion of the silicon substrate beneath the gate structure by the second etching process, such that the heteroatom-containing epitaxial structure subsequently formed in the recess shall not get close to each other to trigger the punch through effect. Therefore, the drawbacks and problems encountered from the prior art can be solved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for fabricating a semiconductor, wherein the method comprising:
   providing a silicon substrate;
   forming a gate structure on a surface of the silicon substrate;
   forming a first silicon nitride layer over the gate structure and the substrate; and
   removing a portion of the first silicon nitride layer and a portion of the silicon substrate to form a first recess but keeping a remaining portion of the first silicon nitride layer on the gate structure;
   forming and a patterned second silicon nitride layer to blanket over the remaining portion of the first silicon nitride layer and a portion of sidewalls of the first recess adjacent to the gate structure;
   using the patterned second silicon nitride layer as a mask to remove a portion of the silicon substrate exposed from the first recess to form a second recess substrate; and
   filling a heteroatom-containing epitaxial material into the first recess and the second recess to form a heteroatom-containing epitaxial structure.

2. The method for fabricating the semiconductor device according to claim 1, wherein the semiconductor device is a P-FET.

3. The method for fabricating the semiconductor device according to claim 1, wherein the surface of the silicon substrate has a lattice direction in <110>.

4. The method for fabricating the semiconductor device according to claim 1, further comprising steps of defining a source/drain area in the heteroatom-containing epitaxial structure.

5. The method for fabricating the semiconductor device according to claim 4, wherein the second recess has a recess with a lattice direction of <111>.

6. The method for fabricating the semiconductor device according to claim 4, further comprising steps of forming a first silicon oxide layer over the gate structure and the silicon substrate, prior to the formation of the first silicon nitride layer.

7. The method for fabricating the semiconductor device according to claim 6, further comprising steps of forming a second silicon oxide layer over the gate structure and the silicon substrate, prior to the formation of the patterned second silicon nitride layer.

8. The method for fabricating the semiconductor device according to claim 4, wherein the step for forming the second recess comprises a wet etching process utilizing ammonia ($NH_3$) as an etching agent.

* * * * *